(12) United States Patent
Carr et al.

(10) Patent No.: US 10,767,259 B2
(45) Date of Patent: Sep. 8, 2020

(54) COMPONENTS WITH AN ATOMIC LAYER DEPOSITION COATING AND METHODS OF PRODUCING THE SAME

(71) Applicant: Agilent Technologies, Inc., Loveland, CO (US)

(72) Inventors: Elizabeth Carr, Mountain View, CA (US); Kevin P. Killeen, Woodside, CA (US)

(73) Assignee: AGILENT TECHNOLOGIES, INC., Santa Clara, CA (US)

( * ) Notice: Subject to any disclaimer, the term of this patent is extended or adjusted under 35 U.S.C. 154(b) by 437 days.

(21) Appl. No.: 14/597,159

(22) Filed: Jan. 14, 2015

(65) Prior Publication Data

US 2015/0122365 A1    May 7, 2015

Related U.S. Application Data

(63) Continuation-in-part of application No. 13/946,942, filed on Jul. 19, 2013, now abandoned.

(51) Int. Cl.
| | | |
|---|---|---|
| *A61N 1/05* | (2006.01) | |
| *B32B 3/26* | (2006.01) | |
| *C23C 16/44* | (2006.01) | |
| *B01D 15/22* | (2006.01) | |
| *C23C 16/04* | (2006.01) | |
| *B01D 15/20* | (2006.01) | |

(Continued)

(52) U.S. Cl.
CPC ............ *C23C 16/44* (2013.01); *B01D 15/206* (2013.01); *B01D 15/22* (2013.01); *C23C 16/045* (2013.01); *C23C 16/45555* (2013.01); *G01N 30/6073* (2013.01); *G01N 2030/567* (2013.01)

(58) Field of Classification Search
CPC .... A61L 31/082; A61L 31/146; A61L 31/148; A61L 31/16; Y10T 428/265
USPC .................................... 428/34.1, 35.7, 36.91
See application file for complete search history.

(56) References Cited

U.S. PATENT DOCUMENTS

| | | | |
|---|---|---|---|
| 4,376,641 | A | 3/1983 | Nestrick et al. |
| 4,968,421 | A | 11/1990 | Spacek et al. |

(Continued)

FOREIGN PATENT DOCUMENTS

| | | |
|---|---|---|
| CN | 1082623 A | 2/1994 |
| CN | 1321752 C | 6/2007 |

(Continued)

OTHER PUBLICATIONS

Notification of Transmittal of the International Search Report and the Written Opinion of the International Searching Authority, or the Declaration for International Application No. PCT/US2015/60651, dated Feb. 23, 2016, 11 pages.

(Continued)

*Primary Examiner* — Ellen S Hock

(57) ABSTRACT

Liquid chromatography and gas chromatography components with a conformal protective coating on internal surfaces thereof and methods for producing the same are provided. The conformal protective coating is formed via an atomic layer deposition (ALD) process. The components and methods of the present disclosure find use in providing protective coatings for liquid chromatography and gas chromatography components that are compatible with bioanalytical separations and sensitive trace analyses.

20 Claims, 10 Drawing Sheets

(51) Int. Cl.
   *C23C 16/455* (2006.01)
   *G01N 30/60* (2006.01)
   *G01N 30/56* (2006.01)

(56) References Cited

U.S. PATENT DOCUMENTS

| | | |
|---|---|---|
| 5,480,677 A | 1/1996 | Li et al. |
| 5,482,628 A | 1/1996 | Schick |
| 5,651,885 A | 7/1997 | Schick |
| 5,736,036 A | 4/1998 | Upchurch et al. |
| 5,871,158 A | 2/1999 | Frazier |
| 6,225,211 B1 | 5/2001 | Tsui |
| 6,225,221 B1 | 5/2001 | Ho et al. |
| 6,380,663 B1 | 4/2002 | Ikedo et al. |
| 6,416,577 B1 | 7/2002 | Suntoloa et al. |
| 6,444,326 B1 | 9/2002 | Smith |
| 6,511,760 B1 | 1/2003 | Barone et al. |
| 6,716,693 B1 | 4/2004 | Chan et al. |
| 6,729,352 B2 | 5/2004 | O'Connor et al. |
| 7,070,833 B2 | 7/2006 | Smith et al. |
| 7,175,812 B2 | 2/2007 | Tatsumi |
| 7,175,815 B2 | 2/2007 | Tatsumi |
| 8,092,770 B2 | 1/2012 | Betz et al. |
| 2002/0011771 A1 | 1/2002 | Ikedo |
| 2002/0070674 A1 | 6/2002 | Nakatsuka et al. |
| 2002/0123606 A1 | 9/2002 | Kurian et al. |
| 2003/0013147 A1 | 1/2003 | Hildenbrand |
| 2003/0152701 A1 | 8/2003 | Kang et al. |
| 2004/0035774 A1 | 2/2004 | Horsman et al. |
| 2004/0066703 A1 | 4/2004 | Sparey-Taylor et al. |
| 2004/0171676 A1 | 9/2004 | Ogata et al. |
| 2004/0238052 A1 | 12/2004 | Karp et al. |
| 2005/0077222 A1* | 4/2005 | Dawes ............... G01N 30/6026 210/198.2 |
| 2005/0255579 A1 | 11/2005 | Weis et al. |
| 2005/0271810 A1 | 12/2005 | Kobrin et al. |
| 2006/0011468 A1 | 1/2006 | Boardman et al. |
| 2006/0171654 A1 | 8/2006 | Hawkins et al. |
| 2006/0223300 A1 | 10/2006 | Simka et al. |
| 2007/0148326 A1 | 6/2007 | Hastings et al. |
| 2008/0145276 A1 | 6/2008 | Betz et al. |
| 2010/0224546 A1 | 9/2010 | Ellis et al. |
| 2010/0245979 A1 | 9/2010 | Lonergan et al. |
| 2010/0298738 A1 | 11/2010 | Felts et al. |
| 2011/0022160 A1* | 1/2011 | Flanagan ............... A61L 31/082 623/1.42 |
| 2011/0133313 A1 | 6/2011 | Rangarajan et al. |
| 2011/0259089 A1 | 10/2011 | Bouvier et al. |
| 2012/0014848 A1 | 1/2012 | Ellis et al. |
| 2012/0118806 A1 | 5/2012 | Steinecker et al. |
| 2012/0219727 A1 | 8/2012 | Gandhiraman et al. |
| 2013/0014567 A1 | 1/2013 | Bunner et al. |
| 2014/0273525 A1 | 9/2014 | Pang et al. |
| 2014/0323981 A1 | 10/2014 | Giraud |
| 2015/0122365 A1 | 5/2015 | Carr et al. |

FOREIGN PATENT DOCUMENTS

| | | |
|---|---|---|
| CN | 101680087 A | 3/2010 |
| CN | 101750449 A | 6/2010 |
| DE | 2523257 | 12/1976 |
| DE | 2829568 | 1/1980 |
| JP | 57161648 A | 10/1982 |
| JP | 2004037266 A | 2/2004 |
| JP | 2007507721 A | 3/2007 |
| JP | 2008511993 A | 4/2008 |
| JP | 2009503821 A | 1/2009 |
| JP | 2011139033 A | 7/2011 |
| JP | 2013527432 A | 6/2013 |
| WO | 0154829 A1 | 8/2001 |
| WO | 2005032688 A1 | 4/2005 |
| WO | 2006026350 A2 | 3/2006 |
| WO | WO20060121573 | 11/2006 |
| WO | 2007013924 A1 | 2/2007 |
| WO | 2008108754 A1 | 9/2008 |
| WO | WO20080106613 | 9/2008 |
| WO | WO20100009311 | 1/2010 |
| WO | WO20110119922 | 9/2011 |
| WO | 2014033359 A1 | 3/2014 |

OTHER PUBLICATIONS

Barone, et al. "Advantages to using Inert, Coated Components for Sampling & Measurement of Organo-Sulfur Compounds", Restek Corporation, pp. 1-5, 2015.
Barone, et al. "Anti-Corrosive and Anti-Coking Properties of Unique Surface Coating for Metal Substrates in Petrochemical Service", Restek Corporation. pp. 1-5, 2015.
Barone, et al, "Selection of Surface Coatings for Process Lines and Equipment used in Corrosive and Reactive Streams", ISA 54th Analysis Division Symposium, pp. 1-5, 2009.
Barone, et al. "Study of Chemical and Physical Adsorption Properties of Moisture, Sulfur, and Mercury Streams Through a Variety of Tubing Substrates", ISA 53rd Analysis Division Symposium, pp. 1-9, 2008.
Bertach, et al. "Deactivation of Metal Surfaces for Capillary Columns for GC by Deposition of Silicon", Short Communications, Journal of HRC & CC, vol. 5, pp. 498-500, 1982.
Firor, et al. "Dual-Channel Gas Chromatographic System for the Determination of Low-Level Sulfur in Hydrocarbon Gases", Agilent Technologies, pp. 1-10, 2003.
Firor, et al. "Use of GC/MSD for Determination of Volatile Sulfur: Application in Natural Gas Fuel Cell Systems and Other Gaseous Streams", pp. 1-10, 2001.
Gerhab, et al. "Highly Inert Sample Pathways", Restek Corporation. pp. 1-18, 2015.
Gerhab, et al. "Efficient and Rapid GC Analysis With Rugged Metal Microbore Capillary Columns", Restek Corporation, pp. 43-58, 1996.
Pretorius, et al. "Gas Chromatography in Glass and Fused Silica Capillary Columns: Deactivation of the Inner Surface Using Silicon Films", Short Communications, Journal of HRC & CC, pp. 344-345, vol. 4, 1981.
Restek, "Restek Performance Coatings Service Through Technology", 1 page, 2003.
Restek, "Silcosteel-CR Achieve specialty alloy performance using austenitic stainless steels!", pp. 1-4, 2004.
Restek, "Silcosteel-UHV Dramatically Reduce Outgassing in UHV Systems", pp. 1-2, 2003.
Schuyler, et al. "Highly efficient and inert stainless steel GC columns: A durable, flexible alternative to fused-silica", Process Control and Quality, vol. 3, pp. 167-171, 1992.
Smith, et al. "The Containment and Transfer of Trace Sulfur Gases at Low-PPBV Levels", Restek Corporation, pp. 1-10, 2015.
Smith, et al. "Evaluation of System Surfaces in Low-Level Sulfur Analysis for the Petrochemical Industry", Restek Corporation, pp. 1-10, 2015.
Smith, et al. "Instrument and Sampling Equipment Passivation Requirements to Meet Current Demands for Low-Level Sulfur Analysis", Restek Corporation, pp. 1-10, 2015.
Smith, et al. "The Deposition and Functionalization of Silicon-Based Materials to Prevent Surface Corrosion, Adsorption, Contamination and Catalytic Interactions", SilcoTek Corporation, MS&T09, pp. 1-6, 2009.
Zeeuw, et al. "Comparing surface adsorption effects during the analysis of mercury and Sulfur containing streams", Restek Corporation, pp. 1-8, 2015.
Zeeuw, Jaap,"Deactivation of Metal Surfaces: Applications in Gas Chromatography (GC) for the Past 15 Years", American Laboratory, pp. 1-10, 2012.
SILCOTEK cover letter, pp. 1-2, 2015.
PCT, "International Search Report and Written Opinion dated Feb. 23, 2016", International Application No. PCT/US2015/60651, 11 pages.
Pretorius, Victor, "Deactivation of Metal Surfaces for Capillary Columns for GC by Deposition of Silicon", Journal of High Resolution Chromatography & Chromatography Communications, vol. 5. Sep. 1962, pp. 498-500.

(56) References Cited

OTHER PUBLICATIONS

Third-Party Submission under 37 CFR 1.290 for PCT/US2010/054058 dated Feb. 27, 2015.
Li, et al.,Octadecyl Modified Nano Silica Coated Capillary Column Application of Capillary Electrochromatography, Journal of Analytical Science vol. 26, No. 1, Feb. 2010, 9 pages.
Dendoovan, J. et al., "Modeling the Conformality of Atomic Layer Deposition: The Effect of Sticking Probability," Journal of the Electrochemical Society, 2009, vol. 156(4), pp. P63-P67.
Goa, F. et al., "Microscopic silicon-based lateral high-aspect-ratio structures for thin film conformality analysis," Journal of Vacuum Science & Technology A, 2015, vol. 33, 010601, 6 pages.
Extended European Search Report dated Jul. 20, 2018, Application No. 15878268.0 , 7 pages.
G. White (personal communication, Feb. 15, 2018), 1 page.

\* cited by examiner

COMPONENTS WITH AN ATOMIC LAYER DEPOSITION COATING AND METHODS OF PRODUCING THE SAME

CROSS-REFERENCE TO RELATED APPLICATION

This application is a continuation-in-part of U.S. application Ser. No. 13/946,942, filed Jul. 19, 2013, the disclosure of which is incorporated herein by reference in its entirety.

INTRODUCTION

Liquid chromatography (LC) is a chromatographic technique used to separate a mixture of compounds with the purpose of identifying, quantifying or purifying the individual components of the mixture. This separation occurs based on the interactions of the sample with the mobile and stationary phases. There are many stationary/mobile phase combinations that can be employed when separating a mixture. Liquid-solid column chromatography, the most popular chromatography technique, features a liquid mobile phase that slowly filters down through the solid stationary phase, bringing the separated components with it.

Gas chromatography (GC) is a chromatographic technique used for identifying, separating and/or analyzing compounds that can be vaporized without decomposition. Typical uses of GC include testing the purity of a particular substance, separating the different components of a mixture (the relative amounts of such components can also be determined), or identifying a compound. In gas chromatography, the mobile phase is a carrier gas, usually an inert gas such as helium or an unreactive gas such as nitrogen. The stationary phase is a layer of liquid or polymer on an inert solid support, inside a column, e.g., a glass or metal tubing.

LC and GC use many metal components for transport of liquids and gases. Examples include pump components, autosampler needles, and separation columns. Many samples analyzed by LC or GC have no interaction with metal, but some samples may be sensitive to leached metal ions and/or are prone to interaction with metal surfaces giving rise to interference with the analytical process or impurities in the isolated components. In addition, in some instances, it may be difficult to produce uniform coatings in high aspect ratio structures, as well as over rough surfaces including surfaces with narrow cavities.

For example, for the flow path for LC applications, a conventional solution has been to use inert materials, such as polyether ether ketone (PEEK). In addition to being expensive, PEEK is difficult to form into many required shapes and sizes of LC components, and not readily available in all forms that are desired. Additionally, PEEK is not as strong as metal mechanically and is therefore unable to withstand the pressures (typically above about 400 bar) that are used for ultra-high pressure LC (UHPLC). Other existing approaches include inserting a biocompatible, polymeric inner tube inside a metallic outer tube and coating the metal tubing with liquid-phase organic layers. (U.S. Pat. Nos. 5,482,628; 5,651,885; 5,736,036; US Patent Application Nos. 20050255579; 20110259089.) Another approach is to use a glass tube inserted into a jacket made of metal or plastic, which has limited applications to LC components. (U.S. Pat. No. 4,968,421.)

Conventional approaches and existing alternative designs have exhibited the disadvantages of not adhering well to the metal surfaces being protected, not being able to coat uniformly down long lengths of small tubing, and not being able to coat small channels (e.g., 5-10 μm diameter).

Thus, there remains an unmet need for metal LC and GC components with continuous and uniformly coated internal surfaces and efficient methods for achieving the same.

SUMMARY

Embodiments of the present disclosure are based in part on methods for controlled and uniform coating of components (e.g., liquid chromatography (LC), gas chromatography (GC), microfluidic device components) having lengthy, narrow and/or constricted interior surfaces. Embodiments of the present disclosure effectively address the problem of corrosion or interference in the flow path for LC or GC analyses in which the sample interacts with metal ions or surfaces. Embodiments of the present disclosure also alleviate difficulties in coating very long tubes and very small channels with an inert, continuous coating that adheres well to the surfaces thereof. The flow path is rendered inert by the coating, and thus compatible with bioanalytical separations, for example, by using an atomic layer deposition process to coat the inner surfaces with a coating that is conformal and continuously covers all surfaces in the flow path. Embodiments of the present disclosure may also facilitate propagation of sample materials through an LC or GC column without substantial loss of the sample. For instance, embodiments of the present disclosure may facilitate propagation of sample materials through an LC or GC column, and thus facilitate higher recovery of the sample after passing through the column, which in turn facilitates in increase in the sensitivity of the analysis device. In certain embodiments, atomic layer deposition (ALD) processes as described herein are unexpectedly effective in the production of conformal protective coatings on interior surfaces of LC or GC components that are sized in the viscous flow regime (e.g., mean free paths of the precursor molecules are much smaller than the diameter of the lumen, allowing gas phase collisions inside the lumen), as opposed to typical atomic layer deposition processes which occur in the molecular flow regime (e.g., mean free paths of the precursor molecules are much larger than the size of the internal channels). In addition, in some instances, embodiments of the subject conformal protective coatings deposited by ALD are unexpectedly effective at providing chemical inertness at low film thicknesses (e.g., 25 nm or less). In general, ALD is a slow deposition process and may take a significant amount of time to produce thicker coatings. In the case of structures with lengthy, narrow and constricted interior surfaces, the deposition may be even slower, because of the time needed to allow precursors to diffuse from outside of the channels throughout the entire length of the channels. In the molecular flow regime, this distance is typically short (~1-100 μm). In the viscous flow regime, this distance can be on the meter scale for a microfluidic device, and hence the diffusion time may be long. For metal structures having a small inner diameter (e.g., the tubing as shown in FIG. 5), a significant amount of surface roughness may be present (e.g., as indicated by the narrow crevices in the surface in FIG. 5). Embodiments of the ALD process described herein can facilitate producing a conformal coating on such rough surfaces. Embodiments of ALD as described herein can generate a protective and inert coating at small film thickness (e.g., 25 nm or less), thus allowing a conformal protective coating to be produced in a practical amount of time.

Aspects of the present disclosure include a component having a lumen with an interior surface covered with a conformal protective coating, where the protective coating is formed via an atomic layer deposition process. The atomic layer deposition process includes: contacting the interior surface of the component with a first molecular precursor in a gas phase for a period of time such that the first molecular precursor reacts to form a deposit on the interior surface of the component, removing unreacted first molecular precursor and reaction byproducts, if any, from the component, and contacting the interior surface of the component with a second molecular precursor in a gas phase for a period of time such that the second molecular precursor reacts with the deposit to form a conformal protective coating on the interior surface of the component.

In some embodiments, the component is a component for a liquid chromatography device, a gas chromatography device, or a microfluidic device.

In some embodiments, the component is composed of stainless steel, titanium, titanium alloy or polymer.

In some embodiments, the atomic layer deposition process further includes repeating the process to produce a desired film thickness and/or composition of the conformal protective coating.

In some embodiments, the lumen is characterized by at least one dimension of 10 mm or less and one dimension of 20 mm or more.

In some embodiments, the conformal protective coating has a substantially uniform thickness. In some embodiments, the conformal protective coating has a substantially uniform thickness of 1 nm to 500 nm.

In some embodiments, the conformal protective coating includes an inorganic compound selected from Si, Pt and Ru, or combinations thereof.

In some embodiments, the conformal protective coating includes a material selected from $SiO_2$, $SiC$, $Si_3N_4$, $SiO_xC_y$ (where $2x+4y=4$), $SiO_xN_y$ (where $2x+3y=4$), $SiC_xH_y$ (where $4x+y=4$), $TiO_2$, $ZrO_2$, $Al_2O_3$, $Y_2O_3$, $Ta_2O_5$, and $HfO_2$, or combinations thereof.

In some embodiments, the conformal protective coating includes two or more layers each composed of a different material.

Aspects of the present disclosure include an atomic layer deposition method for coating with a conformal protective coating an interior surface of a component having a lumen. The method includes: contacting the interior surface of the component with a first molecular precursor in a gas phase for a period of time such that the first molecular precursor reacts to form a deposit on the interior surface of the component, removing unreacted first molecular precursor and reaction byproducts, if any, from the component, and contacting the interior surface of the component with a second molecular precursor in a gas phase for a period of time such that the second molecular precursor reacts with the deposit to form a conformal protective coating on the interior surface of the component.

In some embodiments, the method further includes removing unreacted second molecular precursor and reaction byproducts, if any, from the component.

In some embodiments, removing unreacted first molecular precursor and reaction byproducts includes purging the component with an inert gas.

In some embodiments, the method further includes repeating the method to produce a desired film thickness and/or composition of the conformal protective coating.

In some embodiments, the component is a component for a liquid chromatography device, a gas chromatography device, or a microfluidic device.

In some embodiments, the component is composed of stainless steel, titanium, titanium alloy or polymer.

In some embodiments, the lumen is characterized by at least one dimension of 10 mm or less and one dimension of 20 mm or more.

In some embodiments, the method produces a conformal protective coating having a substantially uniform thickness. In some embodiments, the conformal protective coating has a substantially uniform thickness of 1 nm to 500 nm.

In some embodiments, the method further includes repeating the method using different molecular precursors to produce two or more layers each composed of a different protective material.

BRIEF DESCRIPTION OF THE DRAWINGS

FIG. 10, panel A, shows a gas chromatogram from an experiment with a stainless steel microfluidic channel connected between the inlet and the separation column. FIG. 10, panel B, shows a gas chromatogram from an experiment with an ALD $SiO_2$ coated stainless steel microfluidic channel connected between the inlet and the separation column, according to embodiments of the present disclosure. FIG. 10, panel C, shows a gas chromatogram from an experiment with no microfluidic device between the inlet and column.

DEFINITIONS

Figure 1:
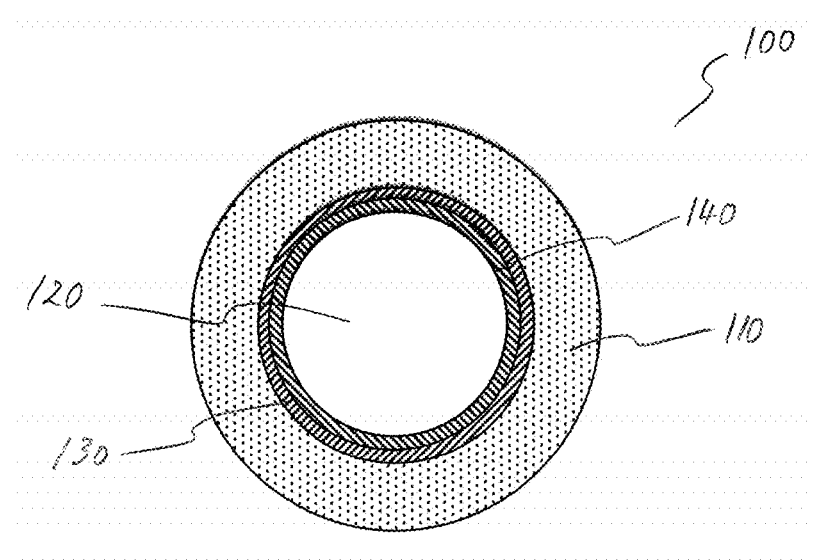
FIG. 1 shows a schematic illustration of an embodiment of the present disclosure having dual layers of coatings.

Unless defined otherwise, all technical and scientific terms used herein have the same meaning as commonly understood by one of ordinary skill in the art to which embodiments of the present disclosure belong.

As used herein, the term "coating" and "coated" refer to a separate and distinct layer of material from an underlying material. A coated material exhibits an identifiable boundary, e.g., diffuse or abrupt, between the coating material and the underlying material, e.g., support material, underlying coating, etc.

As used herein, the term "substantially uniform thickness" refers to a coating over a substrate that has a thickness across the entire coating area that is greater than a minimum thickness. As used herein, the minimum thickness refers to a coating having about 1 nm, about 5 nm, about 10 nm, about 50 nm, about 100 nm or more thickness. A coating with a substantially uniform thickness may have an average thickness that does not substantially vary across the coating, such as an average thickness that varies by 25% or less, such as 20% or less, or 15% or less, or 10% or less, or 7% or less, or 5% or less, or 3% or less. In some cases, a coating with a substantially uniform thickness has an average thickness that varies by 20% or less. The term "average" as used in the present disclosure refers to the arithmetic mean.

As used herein, the term "fluid" refers to a liquid or gas capable of flowing (e.g., through a flow channel) having at least one cross-sectional dimension less than 1 mm. For purposes of this disclosure, the term "fluid" encompasses gasses.

As used herein, the term "microfluidic device" refers to a single unit that has a microfluidic reactor, microfluidic flow channels, and/or valves. Microfluidic devices may also have other microfluidic components, such as pumps, columns, mixers, and the like.

As used herein, the term "chemical vapor deposition" refers to a chemical process used to produce thin films or coatings. In a typical chemical vapor deposition (CVD) process, the substrate is exposed to one or more volatile precursors, which react, decompose, condense or otherwise change on or near the substrate surface to produce the desired deposit. Frequently, volatile by-products are also produced, which are removed by gas flow or vacuum through the reaction chamber. The materials to be deposited may take in various forms, including: monocrystalline, polycrystalline, amorphous, and epitaxial. In a typical CVD process, the substrate is heated to an elevated temperature, which can be important in allowing the precursors to react on the surface. In certain CVD processes, however, the deposition may be performed at room temperature. For example, certain atomic layer deposition (ALD) processes can be performed at ambient temperature.

CVD techniques include: atmospheric pressure CVD (APCVD)—CVD process at atmospheric pressure; low-pressure CVD (LPCVD)—CVD process at sub-atmospheric pressures (reduced pressures tend to reduce unwanted gas-phase reactions and improve film uniformity across the substrate); Ultrahigh vacuum CVD (UHVCVD)—CVD process at very low pressure, for example, below $10^{-6}$ Pa (~$10^{-8}$ torr).

As used herein, the term "molecular precursor" refers to molecules in the gas phase that include one or more of the elements desired to be in the coating. These precursors can undergo a chemical or physical change such that the desired elements can be deposited on the surface and be incorporated in the coating. The molecular precursors can be inorganic or organic compounds. For example, the inorganic molecular precursors can include metal-based materials that would result in protective coating on the surface wherein the protective coating is selected from Si-based, Ti-based, Zr-based or Al-based inorganic compounds (e.g., oxides, nitrides or oxynitrides). The inorganic molecular precursors could also include, for example, $H_2O$ for producing oxides, or $NH_3$ for producing nitrides. For example, the organic molecular precursors can include polymeric materials that can result in Si-based polymeric materials as protective coating on the surface. The molecular precursors can also include metallo-organic materials, for example, tri-methyl aluminum, to provide means for including a metal, in this example, aluminum, into the coating. Many other possibilities for precursors exist and are evident in the literature, and precursors yet to be developed could also fall under the scope of embodiments of the present disclosure.

As used herein, the term "atomic layer deposition" or "ALD" refers to a type of thermal CVD in which layer-by-layer control of deposition of thin films is achieved using sequential, self-limiting surface reactions. The two half-reactions associated with a two precursor deposition are separated in time, and the reactor is purged with inert gas or evacuated to ensure physical separation of the precursors. Each half-reaction is self-limiting, leading to highly conformal and controllable deposition on structures of complex topography and high aspect ratio.

DETAILED DESCRIPTION

Embodiments of the present disclosure provide methods for achieving continuous and uniform interior coating of metal components with lengthy, narrow and constricted interior surfaces. Very long metal tubes with small metal channels can be coated with a continuous and uniform coating, such as an inert or protective coating. These components can be parts, such as the metal tubes and fittings for separation columns (e.g., LC or GC columns), needles autosamplers, pumps, or microfluidic parts. Embodiments of the present disclosure provide metal components that do not corrode or interfere with LC or GC analyses and can be effectively used in the flow path for LC or GC systems.

Embodiments of the present disclosure generally relate to a metallic component having a lumen (e.g., a passageway or cavity through the component) having an interior surface with a protective coating. The protective coating may continuously cover the interior surface and may have a substantially uniform thickness. The protective coating can be formed via a vapor phase process, such as an atomic layer deposition (ALD) process. In general, methods of forming a protective coating on a component include: providing one or more molecular precursors in the gas phase; exposing an interior surface of the lumen, passageway or cavity to the one or more molecular precursors in the gas phase; allowing the one or more molecular precursors to react, decompose, condense or otherwise change at or near the exposed interior surface and subsequently depositing thereon; and flushing with an inert gas or creating a vacuum thus removing unreacted one or more molecular precursors and reaction byproducts, if any.

Figure 4:
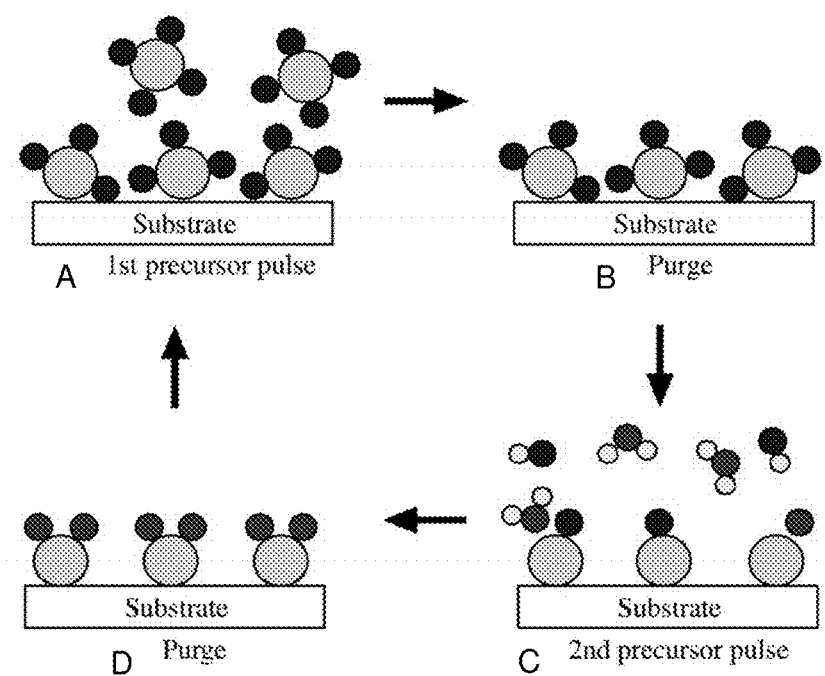
FIG. 4, panels A-D, show a schematic of an atomic layer deposition process according to embodiments of the present disclosure. First and second precursor pulses are separated by purges. Each half-reaction is self-limiting, allowing complete conformal coverage over rough surfaces and high aspect ratios.

More specifically, in certain embodiments of an ALD process, one or more layers of a protective coating may be deposited on a surface of a substrate using sequential, self-limiting surface reactions (see, e.g., FIG. 4). Two half-reactions associated with a two precursor depositions are separated in time. As shown in FIG. 4, panel A, in an ALD process, a first molecular precursor is contacted with the substrate surface. As such, methods of the present disclosure include contacting an interior surface of a component (i.e., the component to be modified with a protective coating) with a first molecular precursor in the gas phase such that the first molecular precursor reacts to form a deposit on the interior surface of the component. For instance, the first molecular precursor or a fragment of the first molecular precursor may react with and be deposited on the interior surface to form the deposit. In some instances, a half-monolayer of elements from the first molecular precursor is formed on the surface of the component. Subsequently, as shown in FIG. 4, panel B, the reactor is purged with inert gas or evacuated to ensure physical separation of the precursors. As such, in some embodiments, the method includes removing unreacted first molecular precursor and reaction byproducts, if any, from the component. In the next step of the ALD process, as shown in FIG. 4, panel C, a second molecular precursor is contacted with the substrate surface. Thus, methods of the present disclosure include the step of contacting the interior surface of the component with a second molecular precursor in the gas phase such that the second molecular precursor reacts with the deposit (e.g., the second molecular precursor reacts with the first molecular precursor or fragment of the first molecular precursor on the interior surface) to form a conformal protective coating on the interior surface of the component. In certain embodiments, the ALD process includes purging with inert gas or evacuating to ensure physical separation of the precursors, as shown in FIG. 4, panel D. Thus, in some instances, the methods of the present disclosure include removing unreacted second molecular precursor and reaction byproducts, if any, from the component. Each half-reaction is self-limiting, leading to highly conformal and controllable deposition on structures of complex topography and high aspect ratio.

In certain embodiments, the vapor phase process further includes: repeating one or more of the above steps as necessary to arrive at a desired film thickness and/or composition. As such, in some instances, the method includes depositing one or more layers of the protective coating on the surface of the substrate. For example, one layer of the protective coating may be deposited on the surface of the substrate by one cycle of the ALD process, e.g., as described in FIG. 4, panels A-D. Multiple layers of the protective coating may be deposited by a corresponding number of cycles of the ALD process. In some instances, 1 or more cycles of the ALD process may be performed, such as 2 or more, 5 or more, 10 or more, 25 or more, 50 or more, 75 or more, 100 or more, 125 or more, 150 or more, 175 or more, 200 or more, 250 or more, 300 or more, 350 or more, 400 or more, 450 or more, 500 or more, 550 or more, 600 or more, 650 or more, 700 or more, 750 or more, 800 or more, 850 or more, 900 or more, 950 or more, 1000 or more, 1100 or more, 1200 or more, 1300 or more, 1400 or more, 1500 or more, 1600 or more, 1700 or more, 1800 or more, 1900 or more, or 2000 or more cycles of the ALD process may be performed. As such, 1 or more layers of the protective coating may be deposited on the surface of the substrate, such as 2 or more, 5 or more, 10 or more, 25 or more, 50 or more, 75 or more, 100 or more, 125 or more, 150 or more, 175 or more, 200 or more, 250 or more, 300 or more, 350 or more, 400 or more, 450 or more, 500 or more, 550 or more, 600 or more, 650 or more, 700 or more, 750 or more, 800 or more, 850 or more, 900 or more, 950 or more, 1000 or more, 1100 or more, 1200 or more, 1300 or more, 1400 or more, 1500 or more, 1600 or more, 1700 or more, 1800 or more, 1900 or more, or 2000 or more layers of the protective coating.

In some embodiments, the thickness of a single layer of the protective coating ranges from 0.01 nm to 1 nm, such as from 0.05 nm to 0.5 nm. In certain cases, the thickness of a single layer of the protective coating is 0.1 nm. The overall thickness of the protective coating (i.e., the total thickness of the one or more layers of the protective coating) depends on the number of cycles of the ALD process performed. For example, if the average thickness of one layer is 0.1 nm, then 500 cycles of the ALD process would produce a protective coating having 500 layers and a total thickness of 50 nm.

In certain embodiments, the layers of the protective coating are composed of the same material, thus forming a multilayered protective coating composed of the same material. In other embodiments, the layers of the protective coating may be composed of different materials. For instance, one or more layers of the protective coating may be composed of a first material, and one or more layers of the protective coating may be composed of a second material that is different from the first material. For example, in some embodiments, one or more layers of the protective coating may be composed of $SiO_2$ and one or more layers of the protective coating may be composed of $TiO_2$. In other embodiments, one or more layers of the protective coating may be composed of $Ta_2O_5$ and one or more layers of the protective coating may be composed of $ZrO_2$. In other embodiments, one or more layers of the protective coating may be composed of $Al_2O_3$ and one or more layers of the protective coating may be composed of $TiO_2$.

Figure 5:
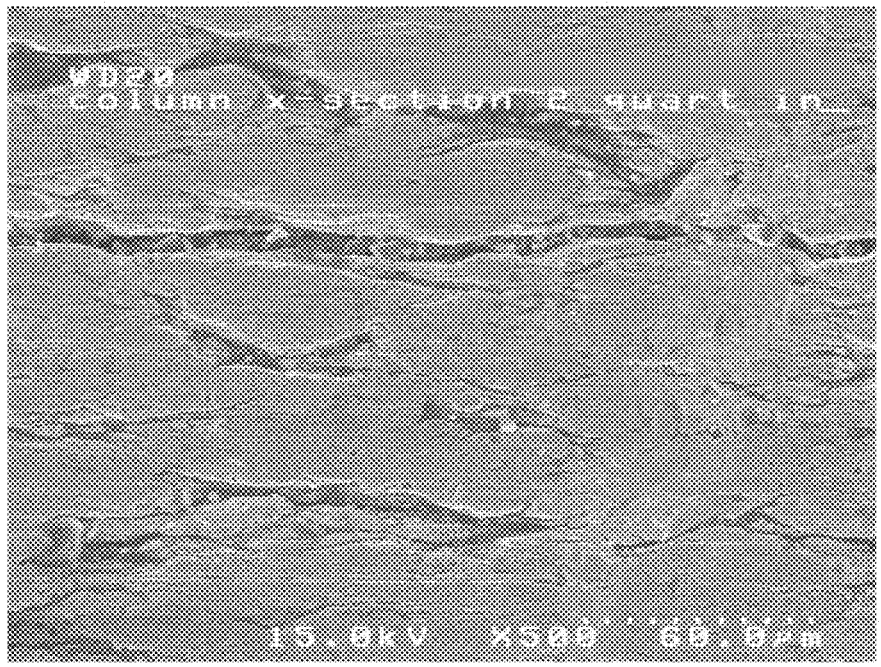
FIG. 5 shows a Scanning Electron Microscopy (SEM) image of the inner surface of a 1 mm inner diameter (ID) HPLC column showing narrow cavities in the surface.

As described above, embodiments of the present disclosure generally relate to a method for coating an interior surface of a component (e.g., a metallic component) having a lumen, passageway or cavity. Embodiments of the method include forming a substantially continuous protective coating having a substantially uniform thickness by a vapor-phase process. In certain embodiments, the vapor phase process includes an atomic layer deposition process as described above. By "continuous" is meant that the protective coating covers substantially the entire surface that is to be coated by the protective coating. For example, a continuous coating includes a coating that has no significant discontinuities, voids, or exposed regions of the underlying substrate or underlying coating. As described above, protective coatings of the present disclosure can be substantially conformal, meaning that the coating conforms to the topography of the underlying substrate or underlying coating. For example, metal structures having a small inner diameter, such as the tubing shown in FIG. 5, may have a significant amount of surface roughness as shown by the narrow crevices in the surface. Embodiments of the ALD process described herein may facilitate producing a conformal coating on rough surfaces, such as a surface as shown in FIG. 5.

Figure 6:
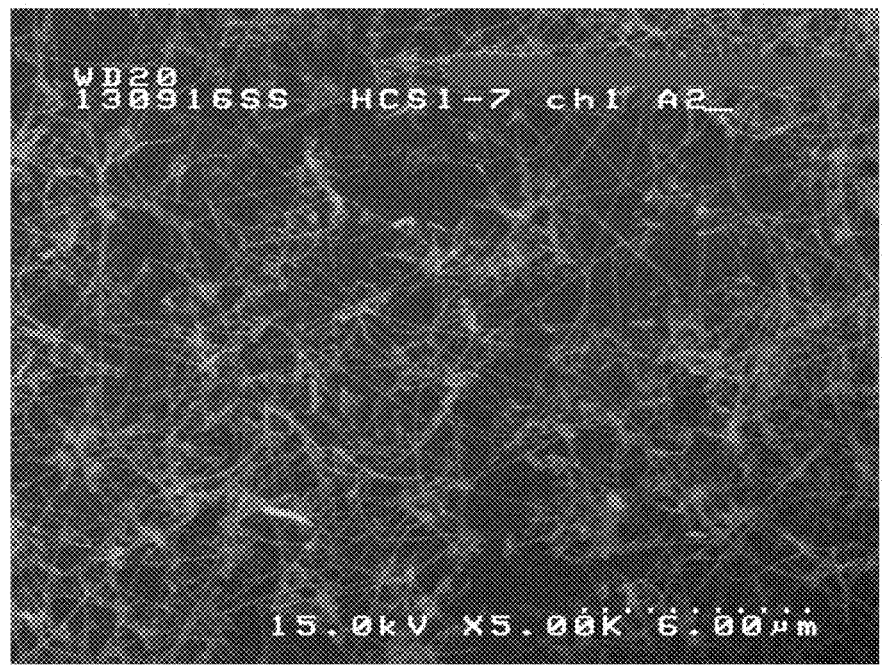
FIG. 6 shows a SEM image of a metal surface coated by CVD displaying extensive Si filaments rather than a smooth coating.
Figure 7:
FIG. 7 shows a SEM image of a siloxane-coated metal surface coated by CVD displaying extensive particles on the surface rather than a smooth coating.

In some instances, embodiments of the present disclosure facilitate the production of protective coating with a minimum of surface defects, such as a coating having substantially no detectable surface defects. For example, due to the chemical reactivity of the gaseous precursors for CVD, reactions can occur between precursor molecules in the gas phase, leading to gas phase nucleation and Si dust formation. Reactions can also occur to form filamentous structures on the substrate surface. These unwanted reactions can lead to coated surfaces that have surface defects, such as particles, whiskers or filaments on the surface. A Scanning Electron Microscopy (SEM) image of an amorphous Si (a-Si) coating with surface defects (e.g., Si filaments) is shown in FIG. 6. An SEM image of a CVD coated metal surface showing particulate surface defects rather than a smooth coating is shown in FIG. 7. These surface defects result in a higher surface area, and can produce unstable surfaces. For instance, particles and/or whiskers that are not well attached to the surface can detach from the surface and be carried downstream into other parts of the GC device. Once located in the GC column, these particles can cause degradation and failure of the separation.

As described above, embodiments of the present disclosure facilitate the production of protective coating with a minimum of surface defects, such as a coating having substantially no detectable surface defects. As described herein, the ALD process of the present disclosure can include the step of removing unreacted molecular precursors and reaction byproducts, if any, between each step of contacting the substrate with a molecular precursor. In some instances, removing the unreacted molecular precursors and/or reaction byproducts includes purging the component with an inert gas. In some instances, removing the unreacted molecular precursors and/or reaction byproducts includes evacuating the reaction chamber containing the component such that substantially no unreacted molecular precursors and/or reaction byproducts remain in the reaction chamber. In some instances, removing the unreacted molecular precursors and/or reaction byproducts includes a combination of purging and evacuating the reaction chamber. Thus, purging with inert gas or evacuation of the reaction chamber ensures physical separation of the molecular precursors so that reaction between the molecular precursors only occurs on the substrate surface, which minimizes the potential for gas phase nucleation and formation of surface defects.

In certain embodiments, the lumen of the component being coated is characterized by at least one dimension of 10 mm or less and one dimension of 20 mm or more. For example, in certain embodiments, the component (e.g., metallic component) is a chromatographic column (e.g., a GC or LC column) characterized by an inner diameter of 10 mm or less (e.g., 5 mm or less, such as 3 mm, 1 mm, 500 µm, 300 µm, 100 µm, 50 µm, 30 µm, 10 µm, 5 µm, 4 µm, 3 µm, 2 µm, 1 µm, 0.5 µm, 0.3 µm, 0.1 µm, or less) and a length of 20 mm or more (e.g., 30 mm or more, such as 50 mm, 100 mm, 200 mm, 300 mm, 400 mm, 500 mm, 600 mm, 700 mm, 800 mm, 900 mm, 1000 mm, 2000 mm, 3000 mm, 4000 mm, 5000 mm, 6000 mm, 7000 mm, 8000 mm, 9000 mm, 10,000 mm, or more). In some instances, the component has an inner diameter of 500 µm. In some instances, the component has an inner diameter of 100 µm. In some instances, the component has length of 800 mm.

In certain embodiments, the protective coating has a substantially uniform thickness ranging from 1 nm to 5 µm (e.g., a thickness ranging from 1 nm to 500 nm, 1 nm to 300 nm, 1 nm to 200 nm, 1 nm to 100 nm, 1 nm to 90 nm, 1 nm to 80 nm, 1 nm to 70 nm, 1 nm to 60 nm, 1 nm to 50 nm, or a thickness ranging from, for example, 1 nm to 1000 nm, or 10 nm to 800 nm, 50 nm to 800 nm, 100 nm to 800 nm, 200 nm to 800 nm, 300 nm to 800 nm, or a thickness ranging from, for example, 100 nm to 500 nm, 100 nm to 300 nm, or 200 nm to 300 nm). In certain instances, the protective coating has a substantially uniform thickness ranging from 1 nm to 50 nm, such as a thickness of 5 nm or 10 nm. In certain instances, the protective coating has a substantially uniform thickness of 50 nm. In certain instances, the protective coating has a substantially uniform thickness of 100 nm.

In certain embodiments, the uniformity of the thickness of the protective coating does not depend of the length of the component. For example, in some instances, given a long enough reaction time, a protective coating having a substantially uniform thickness can be formed on surfaces of long components, e.g., components of 10,000 mm in length, or longer. In certain embodiments, a thin, substantially uniform protective coating as described herein may facilitate a minimization in cracking of the protective coating when exposed to thermal cycling as compared to thicker coatings. In some cases, a thin, substantially uniform protective coating as described herein may facilitate a minimization in gas trapped in the protective coating as compared to thicker coatings, which may, in turn, facilitate a reduction in tailing in the resulting chromatogram.

In certain embodiments, the component is a microfluidic device or a component thereof having at least one interior dimension of 1 mm or less (e.g., 500 µm or less, 300 µm, 100 µm, 50 µm, 30 µm, 10 µm, 5 µm, 1 µm, or less).

The component coated with the protective coating may be a metallic component and may be made of any suitable material, for example, stainless steel, titanium, or titanium alloy. As such, embodiments of the present disclosure generally relate to a component (e.g., a metallic component) having an interior surface coated with a protective coating according to a method disclosed herein. In other embodiments, the component coated with the protective coating as described herein is composed of a polymer. The polymer may be selected from, but is not limited to, polymers such as polyethylene (PE), poly(methyl methacrylate) (PMMA), polypropylene (PP), polystyrene (PS), polyvinyl chloride (PVC), polyvinyl alcohol (PVA), polyimide, combinations thereof, and the like.

As described above, the component to be coated may be a metallic component. For example, the metallic component can be a porous metal frit such as the kind used to hold in place the silica particles that are the solid stationary phase in a liquid chromatographic column. The coating may cover surfaces that will be in contact with the liquid mobile phase and includes interior surfaces and/or exterior surfaces of the porous metal frit.

The protective coating may be any suitable material, such as, but not limited to, an inorganic compound or oxides, nitrides or oxynitrides thereof. For example, the protective coating may be composed of a material selected from Si-based, Ti-based, Zr-based, Al-based, Y-based, Ta-based, Pt-based, Ru-based, and Hf-based inorganic compounds (e.g., oxides, nitrides or oxynitrides), or combinations thereof. As such, the protective coating may be composed of a material that includes Si, Ti, Zr, Al, Y, Ta, Pt, Ru, or Hf, or combinations thereof. In certain embodiments, the conformal protective coating includes an inorganic compound selected from Si, Pt and Ru, or combinations thereof. In certain embodiments (e.g., for metal components used in LC or GC applications), the protective coating includes a material selected from $SiO_2$, $SiC$, $Si_3N_4$, $SiO_xC_y$, $SiO_xN_y$, $SiC_xH_y$, $TiO_2$, $ZrO_2$, $Al_2O_3$, $Y_2O_3$, $Ta_2O_5$, $PtO_2$, $RuO_2$, and $HfO_2$, or combinations thereof. In some instances, the protective coating includes the material $SiO_xC_y$ (where $2x+4y=4$). In some instances, the protective coating includes the material $SiO_xN_y$ (where $2x+3y=4$). In some instances, the protective coating includes the material $SiC_xH_y$ (where $4x+y=4$). In certain embodiments, the conformal protective coating includes a material selected from $SiO_2$, SiC, $Si_3N_4$, $SiO_xC_y$ (wherein $2x+4y=4$), $SiO_xN_y$ (wherein $2x+3y=4$), $SiC_xH_y$ (wherein $4x+y=4$), $TiO_2$, $ZrO_2$, $Al_2O_3$, $Y_2O_3$, $Ta_2O_5$, and $HfO_2$, or combinations thereof.

In certain embodiments, the composition of the protective coating may be chosen based on the desired coating properties, such as coefficient of thermal expansion, thermal conductivity, acid and base resistance, and electrical conductivity, as well as the desired chemical inertness for certain applications.

In certain embodiments, the ALD process described herein is performed at a relatively low temperature. For example, the ALD process may be performed at a temperature of 300° C. or less, such as 250° C. or less, or 200° C. or less, or 175° C. or less, or 150° C. or less, or 125° C. or less, or 100° C. or less, or 75° C. or less, or 50° C. or less, or 25° C. or less. In some cases, the ALD process is performed at a temperature of 200° C. or less.

As described above, the coating can be multilayered (2, 3, 4 or more layers each comprising a different protective material). For example, an initial coating may be a Si coating layer for good adhesion to the metal, followed by a coating of SiC for chemical inertness. FIG. 1 is a schematic illustration of a cross-section of a column 100 with a metallic tubing 110, a passageway 120, and two coated layers on the inside surface, 130 and 140.

As described herein, embodiments of the present disclosure find use in vapor phase coating (e.g., ALD) of metal LC or GC components. For example, vapor phase coating of the flow path of metal LC components in an LC system has several advantages over previous techniques that utilize non-metal components or non-coated metal parts. The coated metal is inert and does not interfere with LC analyses yet is strong enough to withstand pressures over 1,000 bar, making it compatible with conditions required in UHPLC analyses. Fabrication of parts is done in metal, rather than substrate such as PEEK-based materials, so a much greater variety of components are available for fabrication, including metal microfluidic parts and porous sintered metal frits. Vapor phase coating is preferable to liquid-phase coating because it is better able to coat long, narrow channels (e.g., 10 µm or less in diameter) and provide strong adhesion to metal.

The LC components may be fabricated from various metals as required (e.g., stainless steel, titanium or other metals or alloys). Although amorphous Si is effective in protecting metal surfaces exposed to gases or vacuum (U.S. Pat. Nos. 6,444,326; 6,511,760; 7,070,833), amorphous Si is subject to attack at high pH in liquid. Amorphous Si is thus not ideal to provide inertness in LC applications requiring high pH. As disclosed herein, thermal CVD for the deposition of inert coatings is now successfully extended to materials that are stable in both high and low pH solutions, high salt solutions, and a large variety of solvents. In addition, the coating is resistant to adhesion of biomolecules to the coating surface. The coating method according to the present disclosure is able to coat long columns of metal LC components with small inner diameters with a coating that is continuous and adheres well to the metal column.

Embodiments of the present disclosure also find use in gas phase coating (e.g., ALD) of metal components used in mass spectrometry, such as inductively coupled plasma mass spectrometry or liquid chromatography-mass spectrometry. Examples of such mass spectrometry components that may have a conformal protective coating as described herein include, but are not limited to, nebulizers, e.g., pneumatic, cross-flow, Babington, ultrasonic, or desolvating nebulizers. Other examples can include electrospray needles or inlet capillaries.

ADDITIONAL EMBODIMENTS

Components, protective coatings and methods of the present disclosure are further described in detail in U.S. application Ser. No. 13/946,942, filed Jul. 19, 2013, the disclosure of which is incorporated herein by reference in its entirety.

Metal liquid chromatography and gas chomatography components with uniformly coated internal surfaces and methods for achieving the same are provided. The present components and methods address the problem of corrosion or interference of metal components in the flow path for LC and GC analyses in which the sample interacts with metal ions or surfaces. The present components and methods also alleviate the difficulties in coating very long metal tubes and very small metal channels with an inert, continuous coating that adheres well to metal surfaces. The metal flow path is rendered inert by the coating, for example, by using a vapor phase deposition process to coat the inner surfaces with a coating that continuously covers all metal surfaces in the flow path, and is thus compatible with bioanalytical separations.

For example, the present disclosure relates to coated metal components and related methods. More particularly, the present disclosure relates to metal liquid chromatography and gas chromatography components with uniformly coated internal surfaces and methods for achieving the same.

In one aspect, the present disclosure generally relates to a metallic component having a lumen, passageway or cavity having an interior surface continuously covered with a protective coating having a substantially uniform thickness. The protective coating is formed via a vapor phase process that includes: providing one or more molecular precursors in the gas phase; exposing an interior surface of the lumen, passageway or cavity to the one or more molecular precursors in the gas phase; allowing the one or more molecular precursors to react, decompose, condense or otherwise change at or near the exposed interior surface and subsequently depositing thereon; and flushing with an inert gas or creating a vacuum thus removing unreacted one or more molecular precursors and reaction byproducts, if any.

In another aspect, the present disclosure generally relates to a method for coating an interior surface of a metallic object having a lumen, passageway or cavity. The method includes forming a continuous protective coating having a substantially uniform thickness by a vapor-phase process.

In yet another aspect, the present disclosure generally relates to a metallic object having an interior surface coated with a protective coating according to a method disclosed herein.

Aspects of the present disclosure include a metallic component having a lumen, passageway or cavity having an interior surface continuously covered with a protective coating having a substantially uniform thickness, where the protective coating is formed via a vapor phase process. The vapor phase process includes: providing one or more molecular precursors in the gas phase; exposing an interior surface of the lumen, passageway or cavity to the one or more molecular precursors in the gas phase; allowing the one or more molecular precursors to react, decompose or otherwise change at or near the exposed interior surface and subsequently depositing thereon (e.g., depositing on the interior surface of the lumen, passageway or cavity); and flushing with an inert gas thus removing unreacted one or more molecular precursors and reaction byproducts, if any.

In some embodiments, the vapor phase process further includes repeating one of more of the above steps as necessary to arrive at a desired film thickness and/or composition.

In some embodiments, the lumen, passageway or cavity is characterized by at least one dimension of less than about 10 mm and one dimension longer than about 20 mm.

In some embodiments, the metallic component is a chromatographic column characterized by an inner diameter of less than about 10 mm and a length greater than about 20 mm. In some embodiments, the protective coating has a substantially uniform thickness of about 10 nm to about 5 µm.

In some embodiments, the metallic component is a microfluidic device or a component thereof having at least one interior dimension less than about 1 mm. In some embodiments, the protective coating includes a material selected from Si-based, Ti-based, Zr-based and Al-based inorganic compounds. In some embodiments, the protective coating includes a material selected from $SiO_2$, SiC, $Si_3N_4$, $SiO_xC_y$ (wherein 2x+4y=4), $SiO_mN_n$ (wherein 2m+3n=4), $SiC_xH_y$ (wherein 4x+y=4), $TiO_2$, $ZrO_2$, $Al_2O_3$ and mixtures thereof.

In some embodiments, the protective coating includes two or more layers each having a different protective material.

In some embodiments, the metallic component is made of stainless steel, titanium, or titanium alloy.

Aspects of the present disclosure include a method for coating an interior surface of a metallic object having a lumen, passageway or cavity. The method includes forming a continuous protective coating having a substantially uniform thickness by a vapor-phase process.

In some embodiments, the vapor-phase process includes chemical vapor deposition.

In some embodiments, the vapor-phase process includes atomic layer deposition.

In some embodiments, the metallic object is a chromatographic column characterized by an inner diameter of less than about 10 and a length greater than about 20 mm. In some embodiments, the protective coating has a substantially uniform thickness of about 10 nm to about 800 nm.

In some embodiments, the metallic object is a microfluidic device or a component thereof having at least one interior dimension less than about 1 mm.

In some embodiments, the protective coating includes a material selected from Si-based, Ti-based, Zr-based and Al-based inorganic compounds. In some embodiments, the protective coating includes a material selected from $SiO_2$, SiC, $SiC_x(H_y)$, $Si_3N_4$, $TiO_2$, $ZrO_2$ or $Al_2O_3$ and mixtures thereof.

In some embodiments, the protective coating includes two or more layers each having a different protective material.

In some embodiments, the metallic object is made of stainless steel, titanium, or titanium alloy.

As can be appreciated from the disclosure provided above, embodiments of the present disclosure have a wide variety of applications. Accordingly, the examples presented herein are offered for illustration purposes and are not intended to be construed as a limitation on embodiments of the present disclosure in any way. Those of ordinary skill in the art will readily recognize a variety of noncritical parameters that could be changed or modified to yield essentially similar results. Thus, the following examples are put forth so as to provide those of ordinary skill in the art with a complete disclosure and description of how to make and use embodiments of the present disclosure, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations are understood to exist. Unless indicated otherwise, parts are parts by weight, molecular weight is weight average molecular weight, temperature is in degrees Celsius, and pressure is at or near atmospheric.

EXAMPLES

Seven inert coatings were formed and tested on stainless steel and titanium parts (Examples 1 to 7).

Example 1

Amorphous Si Coating

The first coating, an amorphous Si coating, was deposited on stainless steel coupons, frits and HPLC columns, and on titanium coupons. Deposition was done by thermal chemical vapor deposition in a closed reactor using $SiH_4$ gas as a molecular precursor. Temperature for deposition was between 350° C. and 450° C. and partial pressure of $SiH_4$ in the reactor was between 50-1000 mbar in dry nitrogen gas. Two depositions were done in succession to achieve a coating thickness of 550 nm on coupons and 100 nm in the interior of the HPLC column. Coating thickness on the coupons was measured using spectral reflectance and verified by X-ray Photoelectron Spectroscopy. Coating thickness on the column interior was estimated from the relative intensities of the Fe K series and Si K series lines from Energy Dispersive X-ray Spectroscopy, compared to relative intensities on flat surfaces with known a-Si thickness. Thickness of the coating on titanium coupons, deposited in a separate run, was 200 nm.

Effectiveness of the coatings for providing bio-inertness was evaluated by soaking the parts in 0.1% formic acid for a period of days and measuring the metal ions released into solution using Inductively Coupled Plasma-Mass Spectrometry. Both coated stainless steel coupons and coated stainless steel frits provided greater than 10× reduction in metal ion concentration compared to similar uncoated parts.

Figure 2:
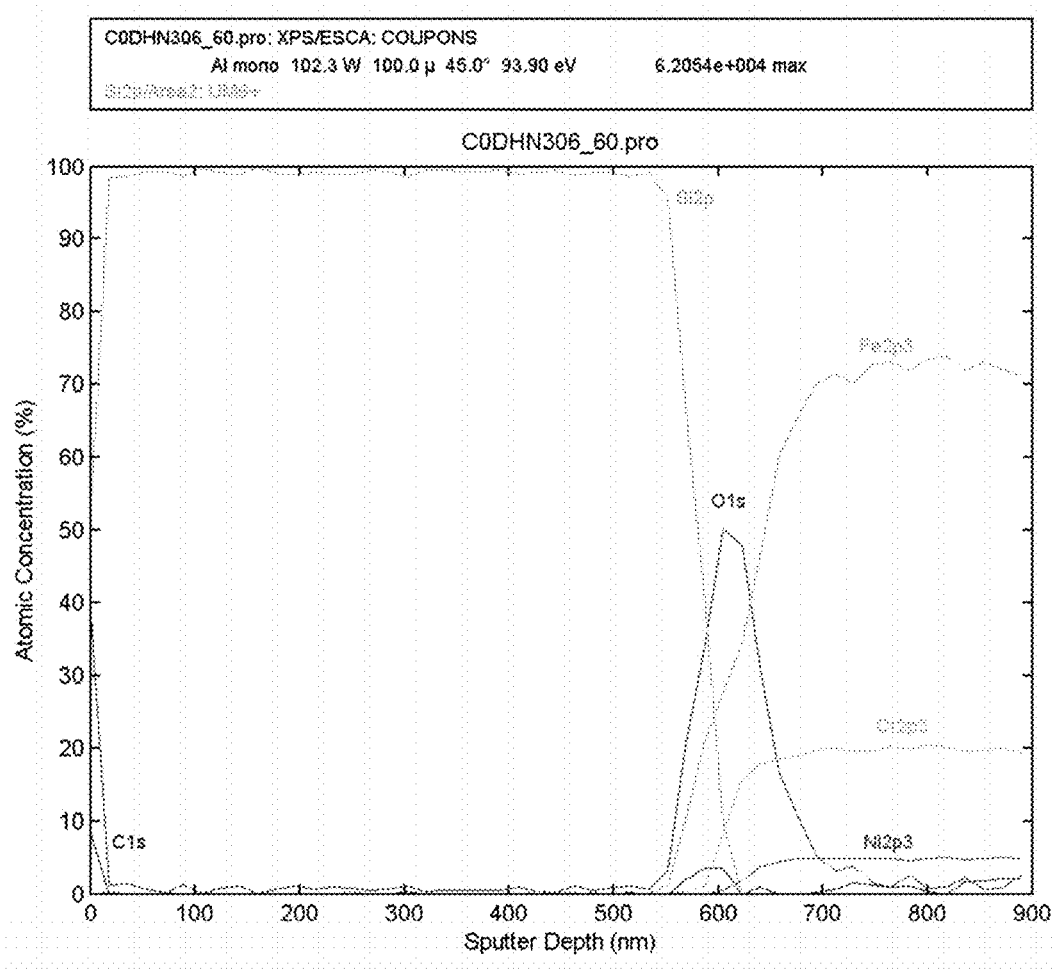
FIG. 2 shows a graph of X-ray Photoelectron Spectroscopy compositional depth profile of a-Si coating on stainless steel.

FIG. 2 shows X-ray Photoelectron Spectroscopy compositional depth profile of a-Si coating on stainless steel.

Example 2

Polymeric Siloxane Coating

The second coating, a polymeric siloxane coating, was deposited using chemical vapor deposition at a temperature between 350° C. and 450° C. Coating thicknesses of 100 nm to 300 nm were achieved on stainless steel coupons, stainless steel frits, and on the interior surface of HPLC columns. All parts demonstrated greater than 10× reduction in metal ion concentration released into solution when soaked in 0.1% formic acid. In addition, a siloxane-coated HPLC column was packed with silica beads held in place by two siloxane-coated frits. This column showed superior performance compared to a stainless steel column with stainless steel frits in a liquid chromatography separation of Cytochrome C, an enzyme known to be sensitive to metal ions.

Example 3

Bilayer Coating (Si/Siloxane)

The third coating was a bilayer consisting of 200 nm of amorphouse Si (a-Si) directly on the stainless steel, covered by 150 nm of siloxane coating on the a-Si. The a-Si coating was deposited by the above described chemical vapor deposition processes on stainless steel coupons. These coupons demonstrated a 10× reduction in metal ion concentration after soaking in 0.1% formic acid. A similar bilayer was also deposited on the interior surface of an HPLC column and demonstrated a superior liquid chromatography separation of Cytochrome C compared to a stainless steel column.

Figure 3:
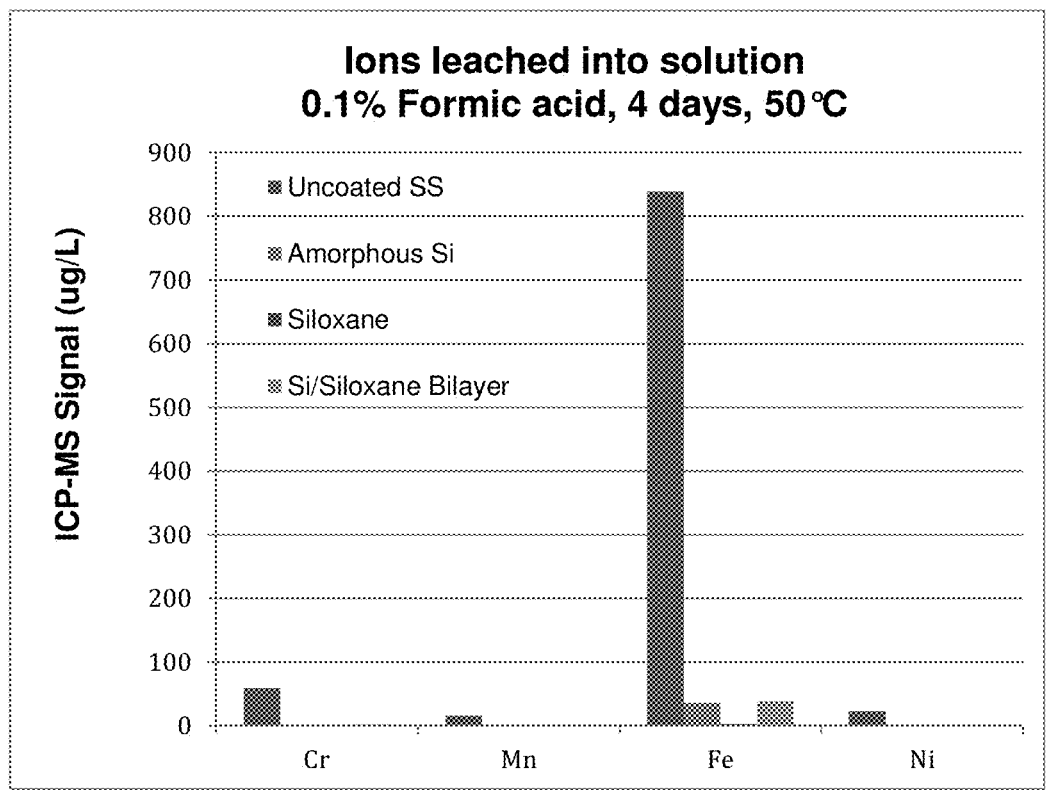
FIG. 3 shows a graph of a comparison of ions leached into solution from 2×3 cm stainless steel coupons coated with a-Si, siloxane, and Si/Siloxane bilayer compared to ions leached from uncoated stainless steel. Coupons were soaked in 0.1% formic acid at 50° C. for four days. Metal ion concentration in solution was measured by Inductively Coupled Plasma-Mass Spectrometry.

FIG. 3 shows comparison of ions leached into solution from 2×3 cm stainless steel coupons coated with a-Si, siloxane, or a Si/siloxane bilayer compared to ions leached from uncoated stainless steel ("uncoated SS"). Coupons were soaked in 0.1% formic acid at 50° C. for four days. Metal ion concentration in solution was measured by Inductively Coupled Plasma-Mass Spectrometry.

As shown in FIG. 3, a protective conformal coating of a-Si, siloxane, or Si/siloxane bilayer significantly reduced leaching of ions into solution as compared to leaching of ions into solution seen with uncoated stainless steel.

Example 4

Bilayer Coating ($Al_2O_3/TiO_2$

The fourth coating was a bilayer of $Al_2O_3$ underneath $TiO_2$, deposited by atomic layer deposition. This $Al_2O_3/TiO_2$ bilayer was deposited on stainless steel coupons and frits, and on the interior and exterior surfaces of 100 mm long capillaries with inner diameters of 100 µm and 250 µm. The coating was deposited with 100 cycles of alternating exposures of trimethyl aluminum and water at 200° C., followed by 827 cycles of alternating exposure of Tetrakis (dimethylamido)titanium(IV) and water at 200° C. Final thickness of the layers was approximately 7 nm of $Al_2O_3$ and 40 nm of $TiO_2$.

Example 5

ALD Coating of Stainless Steel Capillaries

Stainless steel capillaries of length 100 mm and inner diameter of 0.1 mm were coated with 50 nm of $SiO_2$ using ALD. The ALD coating was deposited at 200° C. with 500 cycles of alternating exposures of an amino-alkyl silane silicon precursor and ozone as the oxygen precursor, with sufficient time provided in each exposure for the precursors to diffuse entirely throughout the capillary. Continuous deposition of $SiO_2$ on the internal surfaces along the length of the capillary was verified by Energy Dispersive X-ray Spectroscopy.

Figure 8:
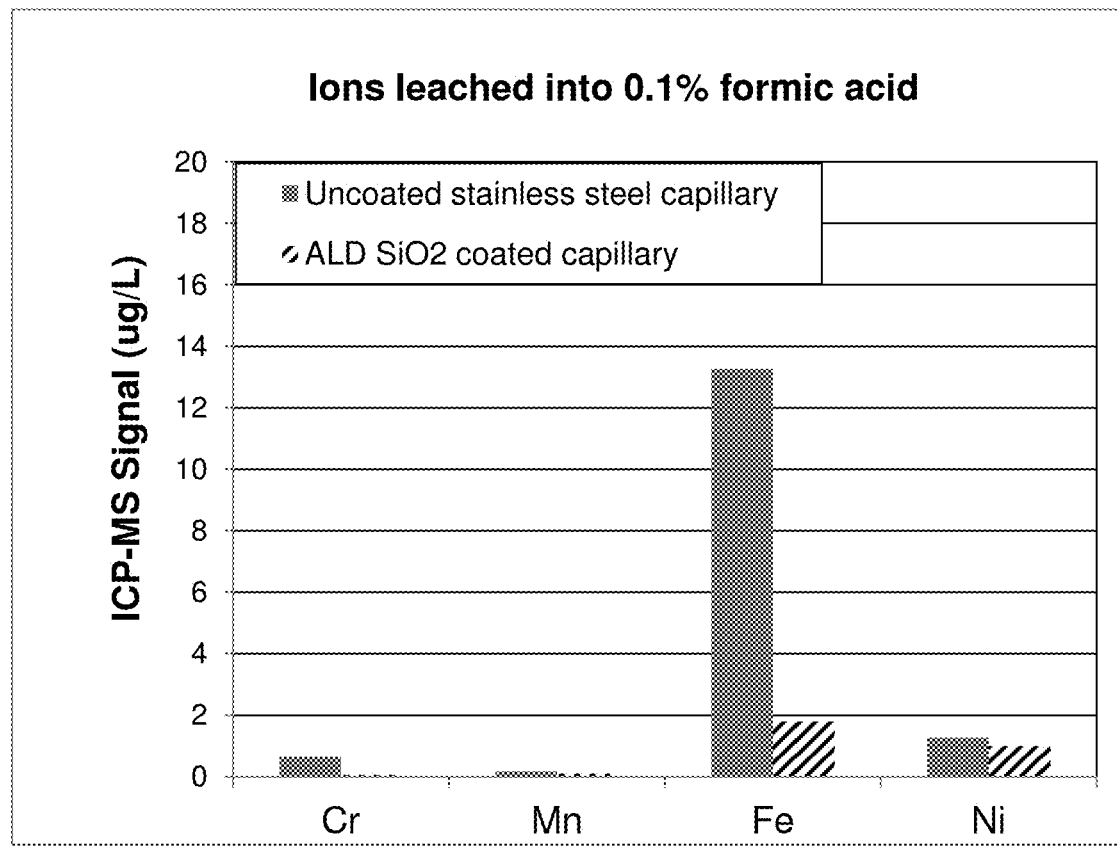
FIG. 8, shows a graphic comparison of ions leached into solution from a 0.1 mm ID×100 mm long ALD $SiO_2$-coated capillary, according to embodiments of the present disclosure, compared to ions leached from an uncoated stainless steel capillary. A solution of 0.1% formic acid was pushed through the capillary at 0.2 ml/hour and collected for analysis. Metal ion concentration in solution was measured by Inductively Coupled Plasma-Mass Spectrometry (ICP-MS).

An ALD $SiO_2$-coated capillary produced as described above was connected to a syringe pump, and 0.1% formic acid was pushed through the capillary at 0.2 ml/hour. After passing through the capillary, the solution was collected in a vial, and the metal ions leached into solution were measured by ICP-MS. As shown in FIG. 8, the number of Fe ions leached into solution in the coated capillary was seven times less than the Fe ions leached into solution from an uncoated stainless steel capillary.

Example 6

ALD Coating of Stainless Steel Capillaries

Stainless steel capillaries of length 100 mm and inner diameter of 0.1 mm were coated with a nanolaminate consisting of thin alternating layers of $Ta_2O_5$ and $ZrO_2$ deposited using ALD. Total thickness of the layers was approximately 70 nm on the interior surface of the capillary near the opening, and decreased in the center of the capillary. The thickness of the $Ta_2O_5$ layers decreased more than the thickness of the $ZrO_2$ layers, leaving primarily $ZrO_2$ coating in the center of the capillary, as measured by EDS.

Figure 9:
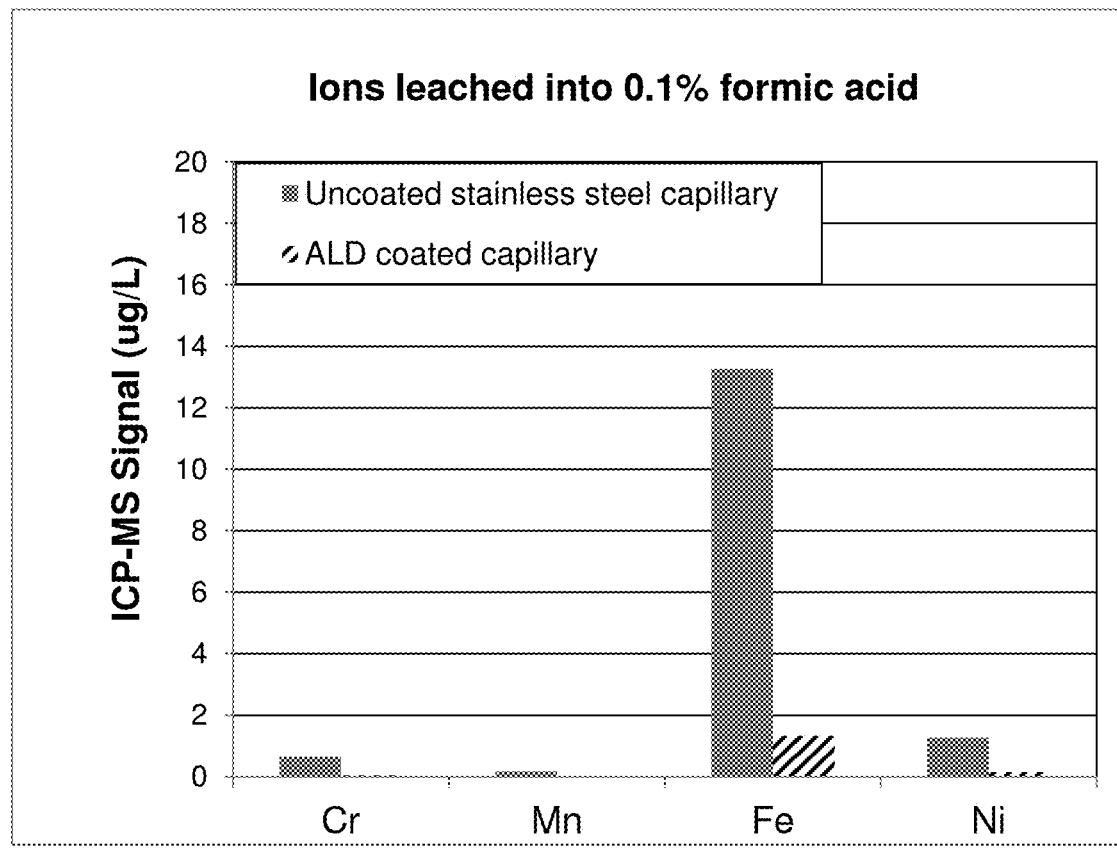
FIG. 9 shows a graphic comparison of ions leached into solution from a 0.1 mm ID×100 mm long ALD $Ta_2O_5/ZrO_2$-coated capillary, according to embodiments of the present disclosure, compared to ions leached from an uncoated stainless steel capillary. A solution of 0.1% formic acid was pushed through the capillary at 0.2 ml/hour and collected for analysis. Metal ion concentration in solution was measured by ICP-MS.

An ALD $Ta_2O_5/ZrO_2$-coated capillary produced as described above was connected to a syringe pump, and 0.1% formic acid was pushed through the capillary at 0.2 ml/hour. After passing through the capillary, the solution was collected in a vial, and the metal ions leached into solution were measured by ICP-MS. As shown in FIG. 9, the number of Fe ions leached into solution in the coated capillary was ten times less than the Fe ions leached into solution from an uncoated stainless steel capillary.

Example 7

ALD $SiO_2$ Coating of a Microfluidic Device

Figure 10:
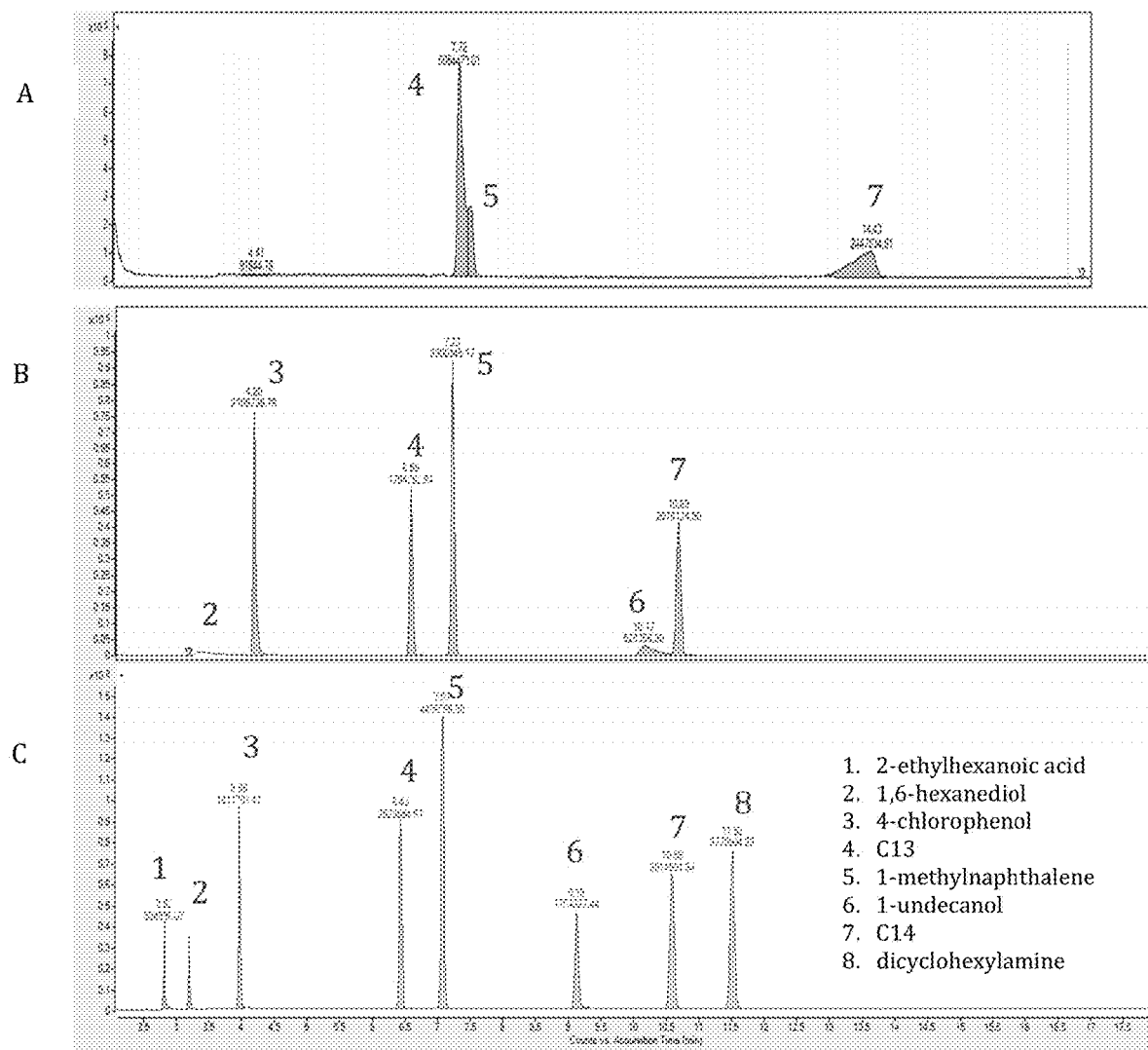
FIG. 10, panels A-C, show gas chromatograms of a mix of test compounds.

A microfluidic device was fabricated in stainless steel with a continuous channel of inner diameter 0.5 mm and length approximately 800 mm. The channel was formed in the device in a folded path to allow the full length of the channel to be incorporated in a planar device of dimensions approximately 25 mm×50 mm×1 mm. When the device was connected between the inlet and the separation column in a gas chromatography instrument, the chemical recovery and chromatographic peak shape of a group of test compounds was poor compared to the recovery and peak shape with no device in place (FIG. 10, panel A and FIG. 10, panel C), indicating significant interaction between the test compounds and the exposed metal surface of the channel. A duplicate device was coated with $SiO_2$ using ALD. The ALD coating was deposited at 200° C. with 500 cycles of alternating exposures of an amino-alkyl silane silicon precursor and ozone as the oxygen precursor, with sufficient time provided in each exposure for the precursors to diffuse entirely throughout the channel. Continuous deposition of $SiO_2$ on the internal surfaces along the length of the channel was verified by Energy Dispersive X-ray Spectroscopy. After the ALD $SiO_2$ deposition, the recovery and peak shape of the test compounds was significantly improved and for some compounds approached the recovery and peak shape with no device in place, as shown in FIG. 10, panel B.

INCORPORATION BY REFERENCE

References and citations to other documents, such as patents, patent applications, patent publications, journals, books, papers, web contents, have been made in this disclosure. All such documents are hereby incorporated herein by reference in their entirety for all purposes. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

EQUIVALENTS

The representative examples disclosed herein are intended to help illustrate embodiments of the present disclosure, and are not intended to, nor should they be construed to, limit the scope of embodiments of the present disclosure. Indeed, various modifications of embodiments of the present disclosure and many further embodiments thereof, in addition to those shown and described herein, will become apparent to those skilled in the art from the full contents of this document, including the examples which follow and the references to the scientific and patent literature cited herein. The following examples contain important additional information, exemplification and guidance that can be adapted to the practice of embodiments of the present disclosure in its various embodiments and equivalents thereof.

What is claimed is:

1. A component having a lumen with an interior surface covered with a conformal protective coating, wherein the conformal protective coating is formed via an atomic layer deposition process comprising:
    contacting the interior surface of the component with a first molecular precursor in a gas phase for a period of time such that the first molecular precursor reacts to form a deposit on the interior surface of the component, wherein
    the component is a tube or channel, and
    the component is a liquid chromatography device, a gas chromatography device, or a micro fluidic device;
    removing unreacted first molecular precursor and reaction byproducts, if any, from the component; and
    contacting the interior surface of the component with a second molecular precursor in a gas phase for a period of time such that the second molecular precursor reacts with the deposit to form a conformal protective coating on the interior surface of the component.

2. The component of claim 1, wherein the component is a liquid chromatography device or a gas chromatography device.

3. The component of claim 1, wherein the component is composed of stainless steel, titanium, titanium alloy or a polymer.

4. The component of claim 1, wherein the lumen is characterized by an inner diameter of 10 mm or less and a length of 20 mm or more.

5. The component of claim 1, wherein the conformal protective coating has a substantially uniform thickness.

6. The component of claim 5, wherein the conformal protective ng has a substantially uniform thickness of 1 nm to 500 nm.

7. The component of claim 1, wherein the conformal protective coating comprises an inorganic compound selected from Si, Pt and Ru, or combinations thereof.

8. The component of claim 1, wherein the conformal protective coating comprises a material selected from Sift, SiC, $Si_3N_4$, $SiO_xC_y$ (wherein 2x+4y=4), $SiO_xN_y$ (wherein 2x+3y=4), $SiC_xH_y$ (wherein 4x+y=4), $TiO_2$, $ZrO_2$, $Al_2O_3$, $Y_2O_3$, $Ta_2O_5$, and $HfO_2$, or combinations thereof.

9. The component of claim 1, wherein the conformal protective coating comprises two or more layers each comprising a different material.

10. An atomic layer deposition method for coating with a conformal protective coating an interior surface of a component having a lumen, the method comprising:
    contacting the interior surface of the component with a first molecular precursor in a gas phase for a period of time such that the first molecular precursor reacts to form a deposit on the interior surface of the component, wherein
    the component is a tube or channel, and
    the component is a liquid chromatography device, a gas chromatography device, or a micro fluidic device;
    removing unreacted first molecular precursor and reaction byproducts, if any, from the component; and
    contacting the interior surface of the component with a second molecular precursor in a gas phase for a period of time such that the second molecular precursor reacts with the deposit to form a conformal protective coating on the interior surface of the component.

11. The method of claim 10, further comprising removing unreacted second molecular precursor and reaction byproducts, if any, from the component.

12. The method of claim 11, wherein removing unreacted first molecular precursor and reaction byproducts comprises purging the component with an inert gas.

13. The method of claim 10, further comprising repeating the method to produce a desired thickness and/or composition of the conformal protective coating.

14. The method of claim 10, wherein the component is a liquid chromatography device or a gas chromatography device.

15. The method of claim 10 wherein the conformal protective coating has a substantially uniform thickness of 1 nm to 500 nm.

16. The method of claim 10, further comprising repeating the method using different molecular precursors to produce two or more layers each comprising a different protective material.

17. The component of claim 1, wherein the lumen has an inner diameter of 1 mm or less.

18. The component of claim 17, wherein the lumen has a length of 50 mm or more.

19. The component of claim 1, wherein the component is a liquid chromatography column or a gas chromatography column.

20. The component of claim 1, wherein the component is a microfluidic device that is a component of a gas chromatograph or a liquid chromatograph.

* * * * *